United States Patent
Blank et al.

(10) Patent No.: US 11,289,425 B2
(45) Date of Patent: Mar. 29, 2022

(54) SEMICONDUCTOR COMPONENT AND METHOD FOR PRODUCING SAME

(71) Applicant: Siemens Aktiengesellschaft, Munich (DE)

(72) Inventors: Rene Blank, Berlin (DE); Martin Franke, Berlin (DE); Peter Frühauf, Falkensee (DE); Rüdiger Knofe, Teltow (DE); Bernd Müller, Falkenberg (DE); Stefan Nerreter, Heidesee OT Blossin (DE); Jörg Strogies, Berlin (DE); Klaus Wilke, Berlin (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 251 days.

(21) Appl. No.: 16/633,301

(22) PCT Filed: Jul. 3, 2018

(86) PCT No.: PCT/EP2018/067971
§ 371 (c)(1),
(2) Date: Jan. 23, 2020

(87) PCT Pub. No.: WO2019/020329
PCT Pub. Date: Jan. 31, 2019

(65) Prior Publication Data
US 2020/0161246 A1 May 21, 2020

(30) Foreign Application Priority Data
Jul. 25, 2017 (DE) ...................... 10 2017 212 739.2

(51) Int. Cl.
*H01L 23/538* (2006.01)
*H01L 21/50* (2006.01)
(Continued)

(52) U.S. Cl.
CPC .......... *H01L 23/5385* (2013.01); *H01L 21/50* (2013.01); *H01L 24/83* (2013.01);
(Continued)

(58) Field of Classification Search
CPC .................................................. H01L 23/5385
See application file for complete search history.

(56) References Cited

U.S. PATENT DOCUMENTS

2006/0103011 A1* 5/2006 Andry ................ H01L 25/0657
257/707
2006/0284309 A1 12/2006 Park et al. ..................... 257/731
(Continued)

FOREIGN PATENT DOCUMENTS

DE  10 2005 023 977 A1   11/2006   ............. H01R 12/58
DE  10 2006 025 453 A1   12/2007   ............. H01L 23/04
(Continued)

OTHER PUBLICATIONS

German Office Action, Application No. 10 2017 212 739.2, 9 pages, dated Jan. 17, 2018.
(Continued)

*Primary Examiner* — Thao P Le
(74) *Attorney, Agent, or Firm* — Slayden Grubert Beard PLLC

(57) ABSTRACT

Various embodiments include a semiconductor component comprising: a first carrier part; a second carrier part arranged opposite the first carrier part; a semiconductor element arranged between the first carrier part and the second carrier part; a contact surface arranged on one of the parts; a contact sleeve arranged on one of the carrier parts opposite the contact surface; and a contact pin with, at one axial end, an end face providing an electrical contact connection of the contact surface and, in a region averted from said axial end, a connection region for the connection of the contact pin (Continued)

with the contact sleeve by means of press fitting. At least one of the first carrier part or the second carrier part comprises a printed conductor connected to the contact surface and/or to the contact sleeve.

9 Claims, 1 Drawing Sheet

(51) Int. Cl.
  *H01L 23/00* (2006.01)
  *H01L 25/16* (2006.01)
  *H01L 25/00* (2006.01)
  *H05K 3/36* (2006.01)

(52) U.S. Cl.
  CPC ............ *H01L 25/165* (2013.01); *H01L 25/50* (2013.01); *H05K 3/368* (2013.01); *H05K 2201/10303* (2013.01)

(56) References Cited

U.S. PATENT DOCUMENTS

| | | | |
|---|---|---|---|
| 2007/0278669 A1 | 12/2007 | Hierholzer et al. | .......... 257/718 |
| 2012/0295490 A1 | 11/2012 | Schneider | ................ 439/709 |
| 2014/0206151 A1 | 7/2014 | Jones | ............................ 438/123 |
| 2015/0188247 A1* | 7/2015 | Sullaj | .................... H01R 12/73 |
| | | | 439/66 |
| 2016/0233146 A1 | 8/2016 | Nakamura | .................... 257/693 |
| 2017/0018524 A1* | 1/2017 | Nashida | ................. H01L 24/16 |
| 2020/0006310 A1* | 1/2020 | Hu | ........................ H01L 25/162 |
| 2020/0135622 A1* | 4/2020 | Dickey | .................. H01R 43/02 |
| 2020/0229305 A1* | 7/2020 | Elsing | .................... H05K 1/144 |
| 2020/0321846 A1* | 10/2020 | Brinkmann | .......... H02K 11/215 |

FOREIGN PATENT DOCUMENTS

| | | | | |
|---|---|---|---|---|
| DE | 10 2013 100 700 B3 | 5/2014 | ............ H01L 21/68 |
| DE | 10 2016 203 581 A1 | 1/2017 | ............. H01L 21/60 |
| EP | 2 194 576 A1 | 6/2010 | ........... H01L 25/065 |
| JP | H03-263771 A | 11/1991 | ................ H05K 3/30 |
| JP | 2001-144399 A | 5/2001 | ............. H01L 23/32 |
| JP | 2001-332866 A | 11/2001 | ............. H01L 23/12 |
| WO | 2019/020329 A1 | 1/2019 | ............. H01L 23/31 |

OTHER PUBLICATIONS

International Search Report and Written Opinion, Application No. PCT/EP2018/067971, 18 pages, dated Oct. 12, 2018.

\* cited by examiner

SEMICONDUCTOR COMPONENT AND METHOD FOR PRODUCING SAME

CROSS-REFERENCE TO RELATED APPLICATIONS

This application is a U.S. National Stage Application of International Application No. PCT/EP2018/067971 filed Jul. 3, 2018, which designates the United States of America, and claims priority to DE Application No. 10 2017 212 739.2 filed Jul. 25, 2017, the contents of which are hereby incorporated by reference in their entirety.

TECHNICAL FIELD

The disclosure relates to semiconductor components.

BACKGROUND

Semiconductor components of the generic type, and methods for producing same, are comprehensively known from the prior art, such that no separate printed documentary evidence is required for this purpose. The semiconductor component is an electronic component, the function of which is to permit the execution of a predeterminable functionality within an electronic hardware circuit. To this end, the semiconductor component comprises one or more electric terminal contacts, by means of which it can be electrically connected to the electronic hardware circuit.

The semiconductor component comprises the semiconductor element, which delivers the electrical functionality of the semiconductor component. The semiconductor element is generally constituted by a semiconductor crystal, which is configured with respect to its crystalline structure, by means of physical and/or chemical processes, in order to permit the execution of a predetermined functionality. This can be, for example, the functionality of a transistor, a diode, a thyristor or composite circuits thereof, including, for example, the constitution of passive electronic components, such as electrical resistors, electrical capacitors and/or similar. The semiconductor component can thus be a transistor, for example a bipolar transistor, a field effect transistor, specifically a metal oxide semiconductor field effect transistor (MOSFET) and/or similar. Moreover, the semiconductor component can also be an isolated gate bipolar transistor (IGBT) or similar. Finally, the semiconductor component can also be a thyristor, for example a TRIAC, a GTO (gate-turn-off thyristor) and/or similar. Naturally, these functionalities can also be delivered by the semiconductor component in virtually any desired combination, specifically in order to permit the delivery of further additional functionalities. The semiconductor component can, for example, embody a bipolar transistor which, by means of a supplementary integrated diode, executes a freewheeling function, if the transistor is energized by an electric voltage applied in reverse.

The semiconductor element is arranged between the first and the second carrier part and is, for example, compressed between the first and the second carrier part by press fitting, or a similar arrangement. Naturally, the semiconductor element can not only be bonded to one or both of the carrier parts by means of mechanical bonding techniques, but can also be bonded to one or both of the carrier parts by means of other bonding techniques, such as soldering, welding, adhesive bonding and/or similar. Combinations hereof can also be provided.

The carrier parts can not only serve for the enclosure and/or location of the semiconductor element, but can also execute a housing functionality. For the constitution of a housing of the semiconductor component, however, separate further housing parts can also be provided, which are provided additionally to the carrier parts. However, these housing parts can naturally also be configured integrally with the carrier parts. The carrier parts and, optionally, also the housing parts, may be constituted of a non-electrically-conductive material, i.e. an insulating material. Depending upon the application, however, it can also be provided that at least one of the carrier parts or the housing parts is constituted of an electrically-conductive material and, as a result, simultaneously constitutes one or more terminal contacts of the semiconductor component. It can moreover be provided that one or both of the carrier parts constitutes an electrical connection of the semiconductor element with the at least one terminal contact of the semiconductor component. To this end, the at least one contact surface is provided, which permits the formation of an electrical contact connection, depending upon the arrangement of the first and the second carrier part in conjunction with the semiconductor element.

Depending upon the design of the semiconductor component and also of the semiconductor element, however, two or more contact surfaces can also be provided, which may be configured in an electrically insulated arrangement in relation to one another. The contact surface may be constituted of an electrically-conductive material, for example copper, silver, aluminum, alloys of the above-mentioned materials and/or similar. By means of the contact surface, the semiconductor element can be electrically and/or mechanically contact connected.

Semiconductor components of the generic type are also commonly employed in the field of power electronics. Semiconductor components of this type, in regulation operation, are generally energized with high electric voltages and/or high electric currents. According to the prior art, for the composition of the semiconductor component and by way of internal connection technology for the contact connection of the at least one semiconductor element, planar electrical, thermal and mechanical connections are employed. For example, in the case of a semiconductor element of a chip-type design, these can be arranged on an underside of the chip or on an upper surface of the chip. In order to achieve the arrangement and an electrical connection of the semiconductor element, the carrier parts can, additionally, be at least partially configured as wiring carriers. Wiring carriers can constitute different wiring planes and connection options for contact surfaces, not only on an underside of a chip, but also on an upper surface of a chip.

In the production of the semiconductor component, and in the semiconductor component itself, the consideration of tolerances in corresponding structural elements, and the common application of an adaptive final measure for the technological management of issues of tolerance, such that a reliable semiconductor component can be delivered, has proved to be a general challenge. Specifically, tolerances in a height of the semiconductor component transversely to the layered structure of the carrier parts and the at least one semiconductor element have proved to be difficult to manage, particularly as, in many cases, the height of the semiconductor component is small in comparison with its other dimensions.

By way of adaptive final measures in semiconductor components of the widest variety of forms of construction, soldered connections with partially adapted volumes of solder may be provided. Although this is a proven method, its application is limited, specifically with respect to the maximum tolerance ranges which can be equalized. In some cases, substantial process risks can also be associated herewith. In many cases, moreover, additional and comprehensive inspection measures are required, in order to permit the confirmation of the reliability of the connection. Moreover, forms of construction which employ, for example, spring contacts or similar for the equalization of tolerances, have proved to be highly complex, specifically in the field of semiconductor components for power electronics.

SUMMARY

The teachings of the present disclosure describe the improvement of an electrical connection technology for semiconductor components of the generic type, and the disclosure of a production method for this purpose. For example, some embodiments of the teachings herein include a semiconductor component (10) having: a first carrier part (12), a second carrier part (14) which is arranged opposite the first carrier part (12), at least one semiconductor element (16) arranged between the first and second carrier part (12, 14), and at least one contact surface (18) of an electrically-conductive material, which is arranged on the semiconductor element (16), on the first carrier part (12) or on the second carrier part (14). Further, some embodiments include a contact sleeve (20) of an electrically-conductive material, which is arranged on the carrier part (12) which is positioned directly opposite the contact surface (18), and is positioned in opposition to said contact surface (18), and a contact pin (22) of an electrically-conductive material which, at one axial end, incorporates an end face (24) for the electrical contact connection of the contact surface (18) and, in a region which is averted from said axial end, incorporates a connection region (26) for the connection of the contact pin (22) with the contact sleeve (20) by means of press fitting, wherein the first carrier part (12) and/or the second carrier part (14) comprises a printed conductor (32) which is connected to the contact surface (18) and/or to the contact sleeve (20).

In some embodiments, the contact sleeve (20) is arranged in an opening in the carrier part (12).

In some embodiments, the end face (24) of the contact pin (22) incorporates an electrically-conductive contact connection agent (28).

In some embodiments, the contact pin (22), at least in an end region of the end face, incorporates a spacer element (30) of an electrically insulating material.

As another example, some embodiments include a method for producing a semiconductor component (10), wherein: at least one semiconductor element (16) is arranged between a first carrier part (12) and a second carrier part (14) which is arranged opposite the first carrier part (12), and at least one contact surface (18) of an electrically-conductive material is arranged on the semiconductor element (16), on the first carrier part (12) or on the second carrier part (14), characterized in that a contact sleeve (20) of an electrically-conductive material is arranged on the carrier part (12) which is positioned directly opposite the contact surface (18), in opposition to said contact surface (18), a contact pin (22) of an electrically-conductive material is arranged such that one end face (24) of an axial end of the contact pin (22) electrically contact connects the contact surface (18), and a connection region (26) of the contact pin (22) is arranged in the contact sleeve (20), in a region which is averted from the axial end, and is connected with the contact sleeve (20) by means of press fitting, wherein the first carrier part (12) and/or the second carrier part (14) comprises a printed conductor (32) which is connected to the contact surface (18) and/or to the contact sleeve (20).

In some embodiments, the contact connection of the contact surface (18) by the end face of the contact pin (22) and/or the connection of the connection region (26) with the contact sleeve (20) is executed upon the assembly of the semiconductor element (16), the first carrier part (12) and the second carrier part (14).

In some embodiments, the contact pin (22), in an end region of the end face, incorporates a spacer element (30) of an electrically insulating material, wherein the spacer element (30) is cured upon the assembly of the semiconductor element (16), the first carrier part (12) and the second carrier part (14).

In some embodiments, prior to the assembly of the semiconductor element (16), the first carrier part (12) and the second carrier part (14), a contact connection agent (28) is applied to the end face (24) of the contact pin (22).

In some embodiments, the press-fit between the connection region (26) and the contact sleeve (20) is constituted upon the assembly of the semiconductor element (16), the first carrier part (12) and the second carrier part (14).

BRIEF DESCRIPTION OF THE DRAWINGS

Further advantages and characteristics proceed from the following embodiments, with reference to the attached figures. In the figures, identical characteristics and functions are identified by the same reference numbers. In the figures.

DETAILED DESCRIPTION

Figure 1:
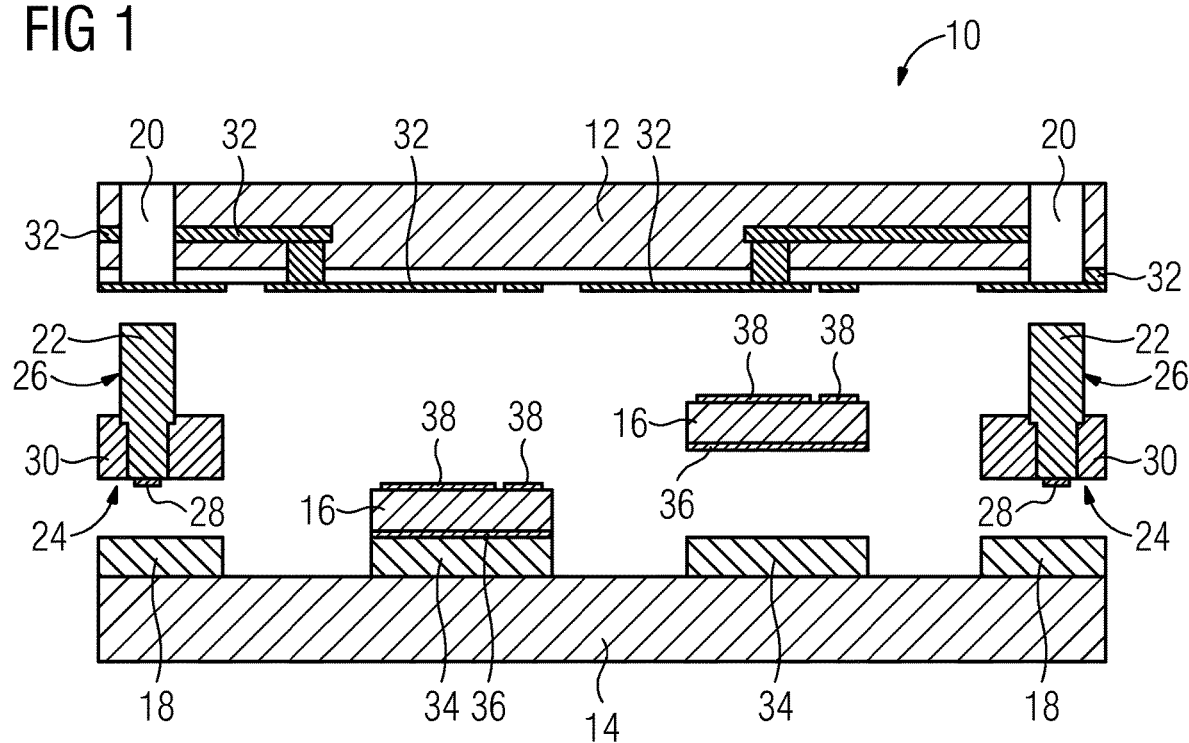
FIG. 1 shows a schematic side view of a semiconductor component, with its constituent parts, prior to an assembly process.

In some embodiments, the semiconductor component comprises a contact sleeve of an electrically-conductive material, which is arranged on the carrier part which is positioned directly opposite the contact surface, and is positioned in opposition to said contact surface, and further comprises a contact pin of an electrically-conductive material which, at one axial end, incorporates an end face for the electrical contact connection of the contact surface and, in a region which is averted from said axial end, incorporates a connection region for the connection of the contact pin with the contact sleeve by means of press fitting.

In some embodiments, a contact sleeve of an electrically-conductive material is arranged on the carrier part which is positioned directly opposite the contact surface, in opposition to said contact surface, a contact pin of an electrically-conductive material is arranged such that one end face of an axial end of the contact pin electrically contact connects the contact surface, and a connection region of the contact pin is arranged in the contact sleeve, in a region which is averted from the axial end, and is connected with the contact sleeve by means of press fitting. In some embodiments, the electrically-conductive contact pin, firstly, is secured in the sleeve by press fitting and, secondly, contact connects the contact surface. It is thus possible, even during the production of the semiconductor component, and specifically during assembly, to deliver a tolerance equalization function, on the grounds that, upon the assembly of the first and second carrier parts, in combination with the semiconductor element, the contact pin is secured in the sleeve in a contact-connecting manner with the contact surface, by press fitting.

Thus, by assembly, the position of the connection region of the contact pin in the contact sleeve can be established, providing a tolerance margin for a potential lifting range of the connection region in the contact sleeve, which can be equalized by means of the teachings herein. As a result, specifically, tolerances can be equalized which, in a semiconductor component of a generally highly planar structure, can only be managed with difficulty according to the prior art. The teachings herein permit the delivery of this tolerance equalization function, even in semiconductor components of very low heights. Tolerance equalization systems which are known from the prior art, some of which are associated with major disadvantages, such as spring elements or similar, can therefore be omitted.

The teachings herein may be particularly advantageous in the field of semiconductor components which are intended for use in power electronics, providing an electrical connection which can also be energized with a high electric current, for example an electric current which is greater than approximately 1 A, an electric current which is greater than approximately 5 A, and specifically an electric current which is greater than approximately 10 A. At such current strengths, and in the light of the limited travel available, for example, for spring elements, such elements generally permit only the highly unsatisfactory achievement of a reliable long-term tolerance equalization function. By means of the teachings herein, conversely, with a high electrical loading capability, and even in a semiconductor component of limited height, good tolerance equalization properties can be provided.

In some embodiments, the height of the semiconductor component may be a dimension which extends over the sequence, or over a layered sequence of the first and the second carrier part, in combination with the semiconductor element interposed therebetween. In general, both the first and the second carrier part, and the semiconductor element are configured as planar, and specifically as disk-shaped parts. In the final assembled state, these parts are preferably mutually contiguous at their large surfaces. The dimension of height, or structural height, may then be measured transversely to an extension of said large surfaces.

The first and/or the second carrier part can be constituted of a non-electrically-conductive material, for example an epoxy resin, specifically a fiber-reinforced epoxy resin, for example FR4, a ceramic material, for example aluminum oxide or similar, combinations hereof and/or similar.

With respect to the semiconductor element, the first and/or the second carrier part can incorporate a corresponding wiring which, for example, is arranged on a respective surface which is assigned to the semiconductor element, or similar. Naturally, it is also possible for a multi-layered structure to be provided, wherein corresponding electrically-conductive connections are also arranged within the first and/or the second carrier part.

The semiconductor element may be constituted by a semiconductor crystal, which delivers the required functionality. The semiconductor element can be constituted, for example, on the basis of silicon, germanium, gallium arsenide, indium gallium arsenide and/or similar. In some embodiments, it is not necessary for the semiconductor component to comprise only one semiconductor element. In some embodiments, the semiconductor component comprises two or more semiconductor elements which, for example, can deliver the same functionality, or can also deliver a different functionality. In some embodiments, one semiconductor element, for example, delivers the functionality of a bipolar transistor, whereas a second semiconductor element delivers the functionality of a diode. A plurality of combinations can be provided here for the constitution of the semiconductor component.

In some embodiments, the semiconductor component can also furthermore comprise control electronics, for example driver electronics, for the control of a transistor and/or similar. In some embodiments, the semiconductor component comprises terminal contacts, the function of which is the electrical and/or mechanical contact connection of the semiconductor component with the electronic circuit in which it is to be arranged. These terminal contacts may be electrically coupled by means of electrical conductors, which specifically can also be constituted by the first and/or the second carrier part, to one or more of the semiconductor elements. Additionally, depending upon their design, the terminal contacts can simultaneously provide a mechanical connection and/or a thermal coupling of the semiconductor component.

If a plurality of semiconductor elements are arranged in one semiconductor component, it is not necessary for these to assume identical dimensions, specifically with respect to height. Different dimensions can be equalized by the first and/or the second carrier part, for example by means of corresponding projections and/or recesses.

In order to permit the execution of the desired electrical interconnection within the semiconductor component, wiring may be provided, which is embodied in the form of electrically-conductive connections. Electrically-conductive connections can be provided either between the at least one semiconductor element and at least the first or the second carrier part, or between the two carrier parts in a mutual arrangement.

The teachings herein thus permit a simple adaptation of height with a wide tolerance margin wherein, simultaneously, a high electrical loading capability of the connection can also be achieved. Execution of the connection can be achieved simultaneously with assembly or an assembly process, wherein height-adaptive layers can also simultaneously undergo strain and/or curing, for example simultaneously with further assembly processes such as sintering, soldering, specifically on an upper surface of the chip or an underside of the chip, and/or similar. The teachings herein are thus specifically suitable for integration, in a simple manner, in existing production processes.

In some embodiments, the contact pin may comprise a contact pin with a circular cross-section. However, it can also assume virtually any other cross-section, for example elliptical, square and/or similar. The selection of the cross-section can be appropriately adapted in accordance with the configuration of the press-fit and the production procedure. The same applies correspondingly to the contact sleeve, which incorporates an opening which may assume a matching configuration to the cross-section of the contact pin. In some embodiments, the sleeve assumes a different cross-sectional outline, wherein the cross-sectional outline is selected such that a press fitting of the contact pin within the opening of the contact sleeve can be achieved. The contact pin can be constituted of a solid material. In some embodiments, the contact pin can also incorporate a void, for example if current distribution in the cross-sectional surface permits the provision of a void or an opening. In some embodiments, this can also be employed to permit the achievement of an improved press-fit, as the contact pin can incorporate a degree of elasticity as a result. The same also applies to the contact sleeve.

The contact sleeve can be a continuous contact sleeve. In some embodiments, it is arranged in the opening in the carrier part and can be configured, for example, by the arrangement of the contact sleeve in said opening. In some embodiments, it is also possible for the contact sleeve to be configured by the application of a metal plating to the opening in the carrier part. The opening for the contact sleeve can be a blind opening or a through-opening.

The contact sleeve, or the associated opening in the respective carrier part, is positioned such that the contact pin, which is connected to the contact sleeve by press fitting, permits the achievement of contact connection with the contact surface. The opening is correspondingly positioned opposite the contact surface.

In some embodiments, the contact pin may comprise at least one end face, which is configured for the electrical contact connection of the contact surface. To this end, the end face can be at least partially configured with a plane surface such that, in the contact-connecting state, it assumes the fullest possible surface contact with the contact surface. In some embodiments, it is also furthermore possible for the end face to incorporate appropriate projections which, in the electrically contact-connecting state, engage in contact with the contact surface. The end face is preferably configured to permit the highest possible take-up of current from the contact surface. In some embodiments, a largest possible connection surface of the end face with the contact surface is therefore selected. A cooling function can also be achieved as a result.

In some embodiments, the contact pin can also be constituted by a combination of materials, for example as a layered structure or similar. The layered structure can be selected to permit the particularly effective adaptation thereof to the respective requirements, for example with respect to electrical conductivity or contact capability at the end face and, with respect to the connection region, by the additional assumption of suitable mechanical properties to support the formation and maintenance of the press-fit.

In some embodiments, the press-fit between the connection region of the contact pin and the contact sleeve is achieved by the appropriate selection of the external dimensions of the connection region of the contact pin or of the inner region of the contact sleeve.

In some embodiments, the contact sleeve is arranged in an opening in the carrier part. It can thus be supported by the carrier part, specifically with respect to the formation and maintenance of the press-fit. The contact sleeve can thus be configured to a highly material-saving design. In some embodiments, the contact sleeve can also be arranged, alternatively, as a separate component on the carrier part, which is connected to the carrier part, for example, at one end, by means of an appropriate bonding technology or similar.

In some embodiments, the application of an electrically-conductive contact connection agent to the end face of the contact pin may be particularly advantageous. The contact connection agent can serve for the reduction of a contact resistance between the contact surface and the end face of the contact pin. A superior current transfer can thus be achieved, such that any power loss at the transition from the contact surface to the contact pin, or at the end face thereof, can be reduced. The contact connection agent can be, for example, an appropriate material of high electrical conductivity, for example tin solder or similar which provides a deformable property such that a surface of the end face of the contact pin can be adapted as effectively as possible to the contact surface. Plastic and/or elastic deformability can be provided.

In some embodiments, the contact pin, in an end region of the end face, incorporates a spacer element of an electrically insulating material. The spacer element can be configured, for example, as a prefabricated preform or similar. In some embodiments, it assumes a height-adaptive property such that, in the connected state, it permits the constitution of a mechanical connection between the first and the second carrier part, or between the semiconductor element and the carrier part which is arranged in opposition thereto. The spacer element can be constituted, for example, of an epoxy resin or similar. The spacer element may be arranged on the contact pin, and is specifically fastened in the region of the end face. For example, it may be provided that the spacer element has a through-opening, in which the contact pin is arranged, in particular is fastened. Both radial and axial fastening can be provided. In some embodiments, the contact pin incorporates a circumferential outer shoulder, with which the spacer element engages and by means of which, during assembly, a force can appropriately be applied thereto. In some embodiments, the shoulder of the contact pin is employed for the maintenance of the spacer element of the contact pin in position during assembly, for the purposes of the formation of the press-fit.

In some embodiments, the first carrier part and/or the second carrier part comprises a printed conductor which is connected to the contact surface and/or to the contact sleeve. It is thus possible, in a simple manner, to permit the provision of wiring by way of a wiring carrier. The printed conductor can be constituted of an electrically-conductive material, for example copper, silver, aluminum, alloys hereof and/or similar. In some embodiments, the first and/or the second carrier part can also be configured in the manner of a printed circuit board, with a plurality of printed conductors and/or contact surfaces and/or contact sleeves. In some embodiments, the printed conductor connects at least one contact surface or one contact sleeve with one terminal contact of the semiconductor component. Subject to requirements, it can also be provided that a plurality of printed conductors are arranged in different and mutually electrically insulated planes of the first and/or the second carrier part. Accordingly, in a simple manner, intersections of printed conductors can also be achieved, with no mutual electrical contact.

In some embodiments, the contact connection of the contact surface by the end face of the contact pin and/or the connection of the connection region with the contact sleeve is executed upon the assembly of the semiconductor element, the first carrier part and the second carrier part. In this manner, by means of a single process step only, namely, the assembly of the above-mentioned parts or elements, the press-fit between the contact sleeve and the contact pin can simultaneously be constituted.

In some embodiments, the contact pin, in an end region of the end face, incorporates a spacer element of an electrically insulating material, wherein the spacer element is cured upon the assembly of the semiconductor element, the first carrier part and the second carrier part. To this end, the spacer element at least partially comprises a curable and electrically insulating material. The material can be constituted, for example, by an epoxy resin or similar. In some embodiments, a fiber-reinforced material can also be considered.

In some embodiments, the spacer element is configured such that, in the assembled state of the first and the second carrier part, with the semiconductor element interposed therebetween, a clearance is defined or constituted between the carrier parts or at least between the semiconductor element and one of the carrier elements arranged in opposition thereto. It can thus be provided that the spacer element initially assumes a larger dimension than that required for the finished semiconductor component. Upon assembly, which can be executed, for example, by means of press fitting, screw connection, riveting and/or similar, the spacer element can then be reduced to the requisite vertical clearance, for example by the action of a force associated with the assembly of the first and/or the second carrier part, or the semiconductor element. In this state, the spacer element can then be cured, such that the dimensions assumed thereby are permanently maintained. Curing of this type can be executed, for example, by means of thermal treatment, irradiation and/or similar. Moreover, it can naturally be provided that curing is initiated by the assembly process itself. This can be achieved, for example, by means of appropriate additives, or similar.

In some embodiments, prior to the assembly of the semiconductor element, the first carrier part and the second carrier part, a contact connection agent is applied to the end face of the contact pin. The contact connection agent, as indicated above, can be constituted by a solder and/or similar, which at least provides good electrical conductivity. Moreover, it is naturally possible, additionally, for good thermal conductivity to be provided, in order to permit the most effective possible cooling of a contact transition from the contact surface to the end face of the contact pin. Heat can be evacuated, for example, via the contact pin itself, to the contact sleeve and thus to the carrier part on which the contact sleeve is arranged. In some embodiments, the contact surface is provided by way of the semiconductor element. Accordingly, the semiconductor element can also be cooled via the contact surface and the contact pin, in addition to the contact sleeve.

The advantages and effects indicated for the semiconductor component apply correspondingly to the method discussed herein, and vice versa. Specifically, as a result, characteristics of the device can also be formulated by way of characteristics of the method, and vice versa.

FIG. 1 shows a schematic representation of a side view of a semiconductor component 10, which comprises a first carrier part and a second carrier part 14, arranged opposite the first carrier part 12. In the present case, the carrier parts 12, 14 are planar parts of a flat design, and simultaneously constitute a housing part such that, further to an assembly process, the first and second carrier parts 12, 14 constitute a housing, which is not represented further.

Between the first and the second carrier part 12, 14, two semiconductor elements 16 are arranged which, in the present case, constitute power components, for example a bipolar transistor in combination with a separate backward diode. In the present configuration, it is provided that the semiconductor elements 16 are fastened to associated contact surfaces 34 which, in turn, are fastened to the second carrier part 14. The semiconductor elements 16 are fastened to the contact surfaces 34 by means of a known bonding technology. In the right-hand central region of FIG. 1, one of the two semiconductor elements 16 is represented, prior to the fastening thereof to the associated contact surface 34. In the left-hand region of FIG. 1, the exemplary fastening of the second semiconductor element 16 to its associated contact surface 34 is represented.

In some embodiments, the semiconductor elements 16 are semiconductor elements which are constituted by silicon chips. These are connected to their respective contact surface 34 in a planar and materially bonded manner. In some embodiments, however, that bonding is executed by friction locking, such that said bonding is achieved by the assembly of the semiconductor component 10, wherein the first carrier part 12 exerts a corresponding force on the semiconductor element 16. In some embodiments, the semiconductor elements 16, prior to assembly, are already fastened on one side to the respective associated contact surfaces 34. It is moreover possible to constitute a connection of the semiconductor elements 16 to both the first and the second carrier part 14, for example by the employment of an assembly material, for example a sintered preform or similar.

In this configuration, the second carrier part 14 comprises contact surfaces 18. The contact surfaces 18 are electrically connected to the contact surfaces 34 in a manner which is not further represented.

The contact surfaces 34 simultaneously constitute a mechanical connection with the semiconductor element 16, and an electrical connection with the semiconductor element 16. To this end, each of the semiconductor elements 16 comprises a respective connection surface 36, which serves for connection with the contact surface and which, in addition to the mechanical connection, also provide an electrical connection.

Figure 2:
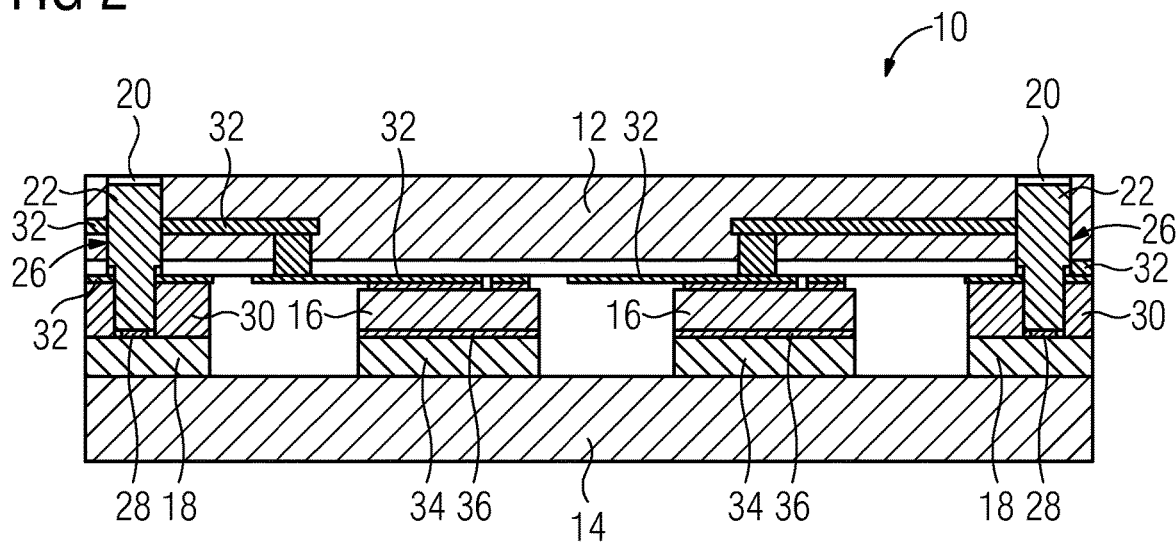
FIG. 2 shows the semiconductor component according to FIG. 1, after the assembly process.

In some embodiments, in opposition to the connection surface 36, the semiconductor elements 16 comprise further connection surfaces 38 which, in the assembled state, are connected to corresponding structures of the first carrier part 12 (c.f. FIG. 2). Accordingly, not only a mechanical attachment of the semiconductor elements 16 in the semiconductor component is achieved, but the semiconductor elements 16 are also electrically connected as a result. To this end, the first carrier part 12 comprises a structure of printed conductors 32, comprising contact surfaces, which are not identified further, for the contact connection of the connection surfaces 38.

The contact surfaces 18, 34 and the printed conductors 32 are constituted of an electrically-conductive material, in the present case of a copper alloy. In some embodiments, further electrically-conductive connections can also be provided, for example silver alloys, aluminum alloys, combinations hereof and/or similar, in order to permit the electrical contact connection of the semiconductor elements 16 and the mechanical fastening of the semiconductor elements 16.

The first carrier part 12 further comprises, arranged on the contact surface 18 in direct opposition to said carrier part 12, a contact sleeve 20 of an electrically-conductive material. The electrically-conductive material can be of the same constitution as the printed conductors 32 and the contact surfaces 18. As required, different materials can, however, also be provided for this purpose. The contact sleeve 20 is positioned in opposition with respect to the contact surface 18. As a result, if the first and the second carrier part 12, 14 are arranged in relation to one another in the corresponding assembly position, the contact surface 18 and the contact sleeve 20 are thus positioned in opposition to one another.

In order to constitute an electrical connection between the contact surface 18 and the contact sleeve 20, the semiconductor component comprises two contact pins 22, also of an electrically-conductive material. Said material can be selected as the material of the contact sleeve 20 or the contact surface 18, or can also deviate herefrom. Each of the two contact pins 22, at one axial end, comprises an end face 24 for the electrical contact connection of the contact surface 18. Each of the contact pins 22 further comprises, in a region which is averted from the axial end, a connection region 26 for the connection of the contact pin 22 with the contact sleeve 20.

The mechanical dimensions of the contact sleeve 20 and the connection region 26, and the selection of the respective materials, are provided such that the connection region 26, in the inserted state in the contact sleeve 20, constitutes a press-fit. This is achieved upon the assembly of the semiconductor component 10, wherein the printed conductor 32 which covers the contact sleeve 20 is penetrated (c.f. FIG. 2). In some embodiments, the opening of the contact sleeve 20 can also be exposed, such that the printed conductor 32 is not penetrated (not represented). In the present case, it is provided that a cross-section of the contact pin 22 in the connection region 26 is greater than a cross-section of a region which is assigned to the end face 24.

In some embodiments, the contact sleeve 20 is arranged in an opening in the first carrier part 12. According to requirements, an inverse arrangement can also be provided, wherein the contact sleeve 20 is arranged in the second carrier part 14 and the contact surface 18 on the first carrier part 12.

In order to permit the effective electrical connection of the end face 24 of the respective contact pin 22 with the contact surface 18, the end face 24 of the respective contact pin 22 incorporates an electrically-conductive contact connection agent 28 which, in the present case, is constituted by solder. In some embodiments, at this location, a sintered connection, a differential soldered connection, a reactive NanoFoil soldered connection or similar can be provided.

By means of the contact connection agent 28, it is possible to constitute a good electrical contact of the contact surface 18 with the contact pin 22, specifically at the end face 24 thereof. To this end, the contact connection agent 28 is preferably elastically or plastically deformable such that, in the assembled state, it can effectively adapt to the contact connection surface 28.

At least in an end region of its end face, each of the contact pins 22 comprises a spacer element 30 of an electrically insulating material. In some embodiments, the spacer element 30 is constituted of an epoxy resin, and simultaneously delivers an element of height adaptivity. In some embodiments, the height of the spacer element 30 is selected such that it is slightly greater than the available clearance between the contact surface 18 and the contact sleeve 20, in the assembled state. As a result, a friction-locked connection of the spacer element with the first and the second carrier part 12, 14 is achieved in the assembled state. To this end, it is further provided that the spacer element 30 is constituted by a prefabricated preform, which is cured in the assembled state, or during assembly.

The contact connection of the contact surface by the end face of the contact pin 22, and the connection of the connection region 26 with the contact sleeve 20, in the present case, are executed upon the assembly of the semiconductor element 16, the first carrier part 12 and the second carrier part 14. Accordingly, upon assembly, the above-mentioned parts, which are represented separately in FIG. 1, are assembled by the action of force to constitute the semiconductor component 10 (FIG. 2).

From FIG. 2, it can be seen that the end of the contact pin 22 which is arranged in opposition to the end face 24 does not entirely penetrate the contact sleeve 20. Tolerance equalization is possible accordingly. The contact sleeve 20 is further connected to the printed conductor 32.

From FIG. 2 it can be seen that, upon assembly, the connection region 26 is compressed into the contact sleeve 20, and the press-fit is constituted accordingly. In some embodiments, tolerances in height can thus be equalized in a simple manner wherein, by means of the contact sleeve 20, a specific and predefined region is provided for the insertion of the connection region 26 of the contact pin 22. It is thus possible to equalize tolerances in height between the first and the second carrier part 12, 14, virtually as required. At the same time, a corresponding adjustment can be achieved by means of the spacer element 30, together with a high electrical loading capability, specifically with respect to an electric current.

In some embodiments, semiconductor components 10 constitute power semiconductors or power components, in which the conduction of high currents must be possible. In some embodiments, the semiconductor component is configured so as to be capable of conducting an electric current of 5 A or higher, specifically of 10 A or higher. Consequently, the contact pin 22, the contact sleeve 20 and the contact surface 18 may be configured for the conduction of such an electric current. In some embodiments, it is possible, essentially independently of tolerances in height, to constitute an effective and reliable electrical connection, which can be energized with a high electric current. In consequence, the reliability of the semiconductor component 10 as a whole can also be improved in regulation operation.

The figures do not represent the terminal contacts of the semiconductor component 10, by means of which said semiconductor component 10, in a predefined manner, can be electrically coupled with a further electronic hardware circuit. These terminal contacts are connected, in an appropriate manner, to the printed conductors 32 and/or the contact surfaces 18 and/or the contact sleeves 20.

The description is intended solely for the clarification of the teachings herein, and does not constitute any limitation of the scope thereof. Naturally, although the teaching are specifically appropriate for power semiconductors, their application is not limited to the latter. Additionally, they can be employed in other applications in the field of electronics in which, inter alia, an equalization of critical tolerances, specifically in height, may be required.

LIST OF REFERENCE NUMBERS

10 Semiconductor component
12 First carrier part
14 Second carrier part
16 Semiconductor elements
18 Contact surface
20 Contact sleeve
22 Contact pin
24 End face
26 Connection region
28 Contact connection agent
30 Spacer element
32 Printed conductor
34 Contact surface
36 Connection region
38 Connection region

What is claimed is:
1. A semiconductor component comprising:
a first carrier part;
a second carrier part arranged opposite the first carrier part;
a semiconductor element arranged between the first carrier part and the second carrier part;

a contact surface comprising an electrically-conductive material arranged on at least one of: the semiconductor element, the first carrier part, or the second carrier part;

a contact sleeve comprising an electrically-conductive material arranged on one of the carrier parts positioned directly opposite the contact surface, and positioned in opposition to said contact surface; and a contact pin comprising an electrically-conductive material with, at one axial end, an end face providing an electrical contact connection of the contact surface and, in a region averted from said axial end, a connection region for the connection of the contact pin with the contact sleeve by means of press fitting;

wherein at least one of the first carrier part or the second carrier part comprises a printed conductor connected to the contact surface and/or to the contact sleeve.

2. The semiconductor component as claimed in claim 1, wherein the contact sleeve is arranged in an opening in the carrier part.

3. The semiconductor component as claimed in claim 1, wherein the end face of the contact pin includes an electrically-conductive contact connection agent.

4. The semiconductor component as claimed in claim 1, wherein the contact pin comprises a spacer element including an electrically insulating material.

5. A method for producing a semiconductor component, the method comprising:

arranging a semiconductor element between a first carrier part and a second carrier part arranged opposite the first carrier part; and wherein a contact surface comprising an electrically-conductive material is disposed on at least one of: the semiconductor element, the first carrier part, or the second carrier part;

wherein one of the carrier parts comprises a contact sleeve including an electrically-conductive material positioned directly opposite the contact surface, in opposition to said contact surface;

wherein a contact pin comprising an electrically-conductive material is arranged such that one end face of an axial end of the contact pin electrically contact connects the contact surface; and connecting a connection region of the contact pin arranged in the contact sleeve, in a region averted from the axial end, with the contact sleeve by a press fit; and wherein the first carrier part and/or the second carrier part comprises a printed conductor connected to the contact surface and/or to the contact sleeve.

6. The method as claimed in claim 5, wherein the contact connection of the contact surface by the end face of the contact pin and/or the connection of the connection region with the contact sleeve is executed upon the assembly of the semiconductor element, the first carrier part and the second carrier part.

7. The method as claimed in claim 5, wherein the contact pin, in an end region of the end face, incorporates a spacer element of an electrically insulating material, wherein the spacer element is cured upon the assembly of the semiconductor element, the first carrier part and the second carrier part.

8. The method as claimed in claim 5, further comprising applying a connection agent to the end face of the contact pin prior to the assembly of the semiconductor element, the first carrier part, and the second carrier part.

9. The method as claimed in claim 5, wherein the press-fit between the connection region and the contact sleeve is constituted upon the assembly of the semiconductor element, the first carrier part, and the second carrier part.

* * * * *